(12) United States Patent
Pekny et al.

(10) Patent No.: US 7,352,643 B2
(45) Date of Patent: *Apr. 1, 2008

(54) REGULATING VOLTAGES FOR REFRESH OPERATION USING FLASH TRIM BITS IN SEMICONDUCTOR MEMORY DEVICES

(75) Inventors: Theodore T. Pekny, Miltitas, CA (US); Stephen J. Gualandri, Campbell, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/619,414

(22) Filed: Jan. 3, 2007

(65) Prior Publication Data

US 2007/0109877 A1 May 17, 2007

Related U.S. Application Data

(63) Continuation of application No. 10/917,608, filed on Aug. 13, 2004, now Pat. No. 7,173,869, which is a continuation of application No. 10/170,161, filed on Jun. 12, 2002, now Pat. No. 6,791,893.

(51) Int. Cl.
*G11C 7/00* (2006.01)

(52) U.S. Cl. .................. 365/222; 365/189.09; 327/535
(58) Field of Classification Search ................ 365/103, 365/189.09 X, 194, 229, 189.09, 222; 327/535 X, 327/535

See application file for complete search history.

(56) References Cited

U.S. PATENT DOCUMENTS

| | | | |
|---|---|---|---|
| 5,952,871 A * | 9/1999 | Jeon | 327/535 |
| 6,002,620 A * | 12/1999 | Tran et al. | 365/200 |
| 7,173,869 B2 * | 2/2007 | Pekny et al. | 365/222 |

* cited by examiner

*Primary Examiner*—Van Thu Nguyen
(74) *Attorney, Agent, or Firm*—Williams, Morgan & Amerson, P.C.

(57) ABSTRACT

A method and apparatus for regulating voltages in semiconductor devices. Trim bits are stored in a trim flash array, where the trim bits define a voltage value and where the voltage value is accessible once a control signal representing a word line signal is provided to the trim flash array reaches a selected voltage level. A refresh signal is provided to a voltage regulator in response to the control signal reaching the selected level, causing the voltage regulator to change its regulation value to that defined by the trim bits. A signal at a voltage level represented by the voltage value is provided to a memory array that is accessed based on the provided signal.

11 Claims, 5 Drawing Sheets

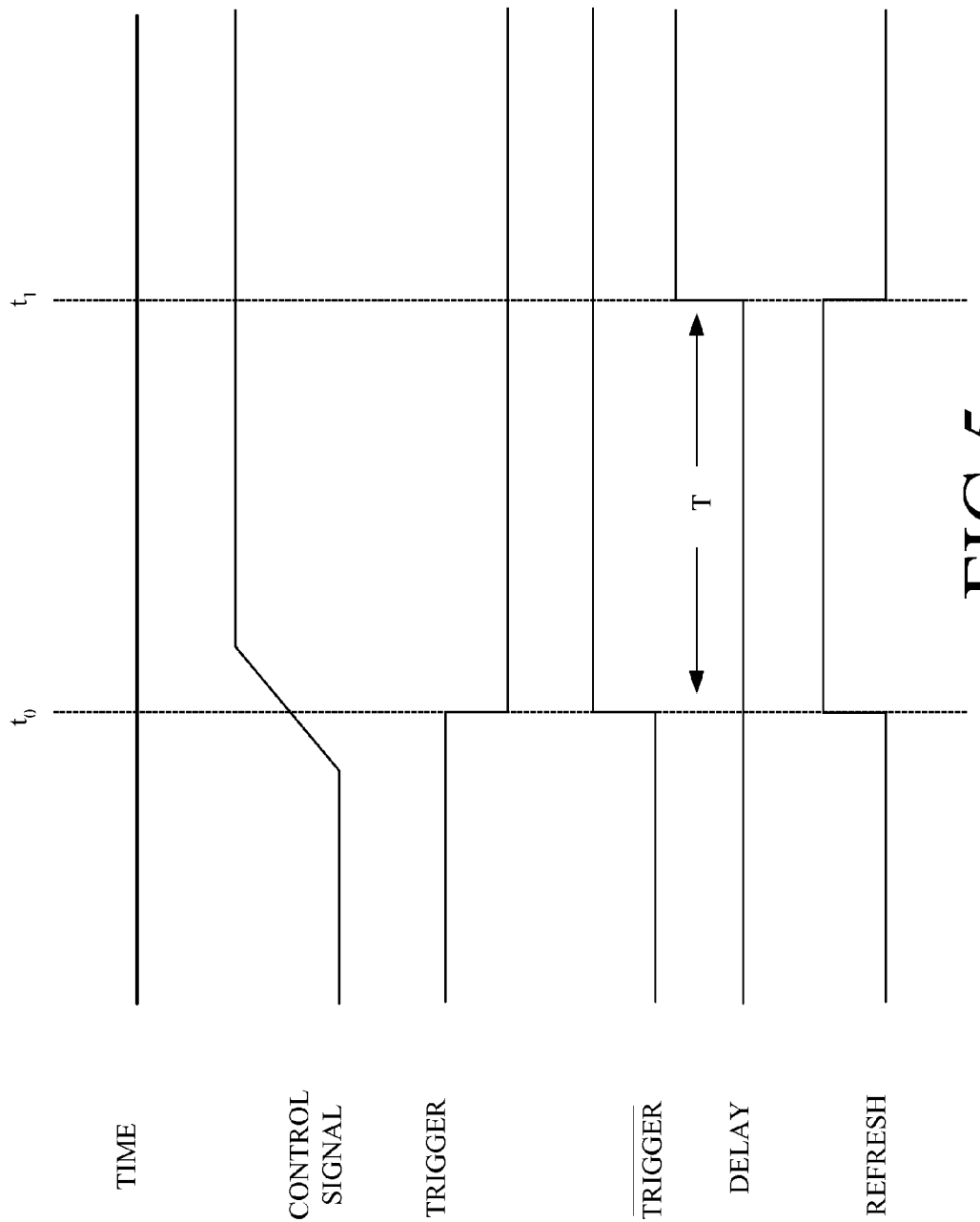

REGULATING VOLTAGES FOR REFRESH OPERATION USING FLASH TRIM BITS IN SEMICONDUCTOR MEMORY DEVICES

CROSS-REFERENCE TO RELATED APPLICATION

This is a continuation of application Ser. No. 10/917,608 filed Aug. 13, 2004 now U.S. Pat. No. 7,173,869, which is a continuation of Ser. No. 10/170,161 filed Jun. 12, 2002 now U.S. Pat. No. 6,791,893, issued Sep. 14, 2004.

BACKGROUND OF THE INVENTION

1. Field of the Invention

This invention generally relates to semiconductor memory devices, and, in particular, to regulating voltages in a memory, such as flash memory.

2. Description of the Related Art

Advancements in the memory technology have resulted in improved memories at a lower price. For example, flash memories today store a greater number of bits per area at an overall lower cost-per-megabyte. The affordable price of flash memory has made it a popular choice among many application developers.

Flash memory (sometimes called "flash RAM") is a type of non-volatile memory that can be erased and reprogrammed in units of memory called blocks. Flash memory is a variation of electrically erasable programmable read-only memory (EEPROM) that, unlike flash memory, is erased and rewritten at the byte level, which is slower than flash memory updating. Flash memory is commonly used to hold control code such as the basic input/output system (BIOS) in a personal computer. When BIOS needs to be changed (rewritten), the flash memory can be written in block (rather than byte) sizes, making it faster to update. Applications employing flash memory include digital cellular phones, digital cameras, LAN switches, computers, digital set-up boxes, embedded controllers, and other devices.

Flash memories generally use factory programmed trim bits (sometimes also referred to as "option bits") to configure the operation of the memory. The trim bits may be utilized to configure a variety of different settings in the memory, including voltage regulation levels and other marketing options. It may be desirable to regulate voltage levels in the memory during power up, for example, using voltage regulators, such as capacitor-divider voltage regulators. Furthermore, it may be desirable to have the new voltage take affect soon after the trim bits provide the new regulation voltage level. However, because selected voltage regulators, such as capacitor-divider voltage regulators, generally cannot change their voltage regulation value without a proper refresh of the capacitors, the new regulation value may not take effect as quickly as desired, thereby causing the regulators to operate unregulated.

SUMMARY OF THE INVENTION

In one aspect of the instant invention, a method is provided for regulating voltages in semiconductor devices. The method comprises providing a first voltage level using a voltage regulator, determining that a second voltage level is desired and initializing the voltage regulator to provide the second voltage level based on determining that the second voltage level is desired.

In another aspect of the instant invention, an apparatus is provided for regulating voltages in semiconductor devices. The apparatus comprises at least one storage cell, a refresh circuit, and a voltage regulator. The at least one storage cell is adapted to provide a voltage regulation value in response to receiving a control signal. The refresh circuit is adapted to provide a refresh signal based on receiving the control signal and a voltage regulator is communicatively coupled to the storage cell and the refresh circuit. The voltage regulator is adapted to provide a signal of a voltage level that is indicated by the voltage regulation value based on receiving the refresh signal.

In yet another aspect of the instant invention, a system is provided for regulating voltages in semiconductor devices. The system comprises a device and a memory. The memory is accessible by the device. The memory comprises a refresh circuit and a capacitor-divider voltage regulator. The refresh circuit is adapted to provide a refresh signal in response to determining that a change in a voltage level is desired. The capacitor-divider voltage regulator is adapted to provide a signal of a voltage level that is indicated by the voltage regulation value based on receiving the refresh signal.

BRIEF DESCRIPTION OF THE DRAWINGS

The invention may be understood by reference to the following description taken in conjunction with the accompanying drawings, in which like reference numerals identify like elements, and in which:

FIG. 5 illustrates a timing diagram of the portion of the memory of FIG. 2, in accordance with one embodiment of the present invention.

Figure 1:
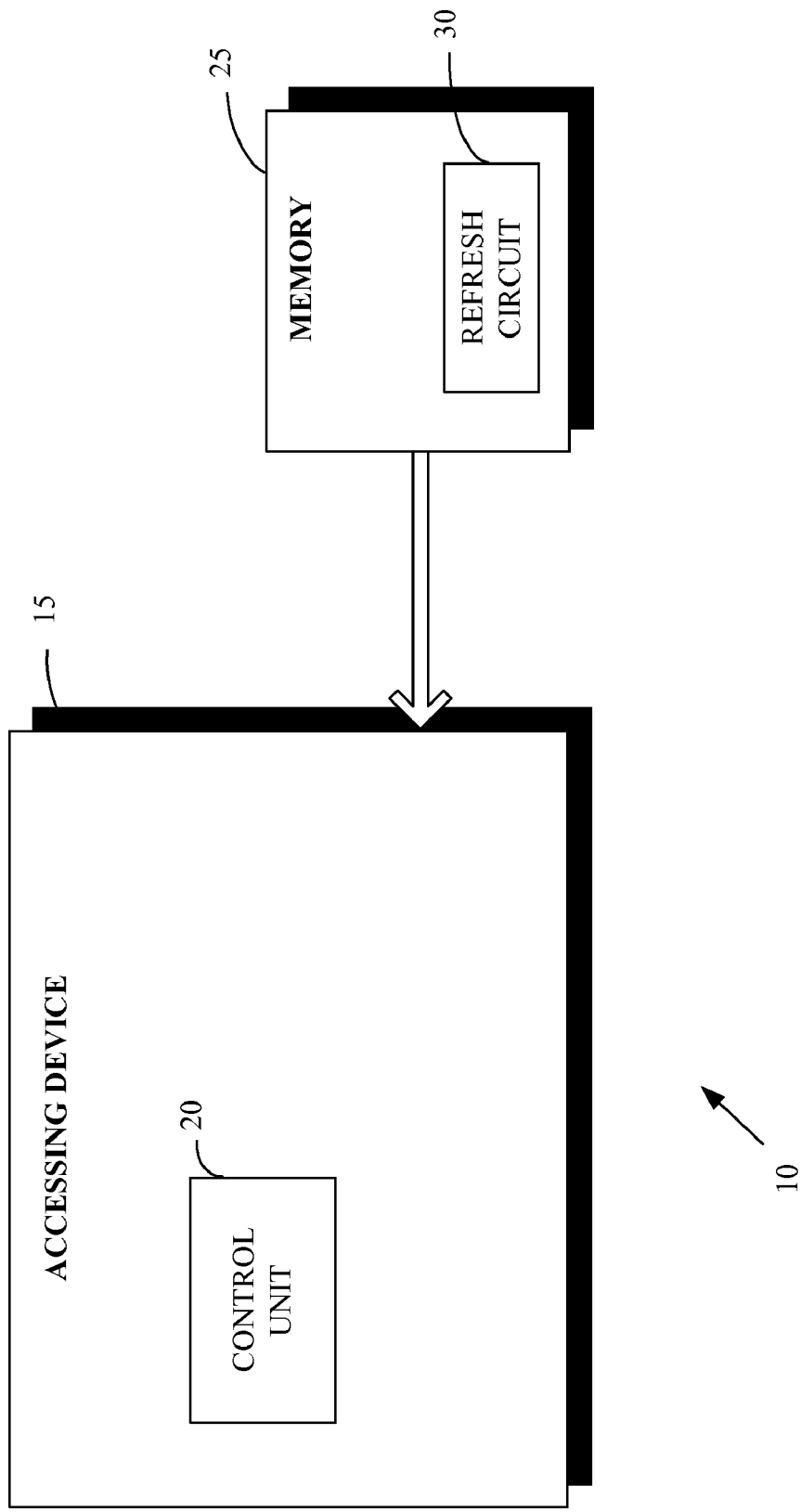
FIG. 1 is a block diagram of a system including a device that is capable of accessing a memory having a refresh circuit, in accordance with one embodiment of the present invention.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

Referring to FIG. 1, a block diagram of a system 10 is illustrated, in accordance with one embodiment of the present invention. The system 10 includes an accessing device 15 having a control unit 20 that is capable of accessing data (including code) stored in a memory 25. The accessing device 15 may be any device that uses the memory 25 to store data, read data, or both. Examples of the accessing device 15 may include, but are not limited to, a computer, camera, telephone, television, radio, calculator, personal digital assistant, network switch, setup-box, and the like.

The control unit 20, in one embodiment, may manage the overall operations of the accessing device 15, including writing and reading data to and from the memory 25. The control unit 20 may include a microprocessor, a microcontroller, a digital signal processor, a processor card (including one or more microprocessors or controllers), a memory controller, or other control or computing devices.

The memory 25 in the illustrated embodiment is a non-volatile memory, such as flash memory. The memory 25, in one embodiment, may be an external memory, such as a memory stick, and may be accessed when inserted into a slot (not shown) of the accessing device 15. When inserted into the accessing device 15, the accessing device 15 provides the appropriate power and control signals to access the memory 25. An external memory 25 may also be accessed by the accessing device 15 through, for example, an external cable. In one embodiment, the memory 25 may be internal to or integrated in the accessing device 15. The accessing device 15, such as a computer, may employ an integrated memory 25 to store, for example, the BIOS (basic input/output system) of the accessing device 15.

The memory 25 in the illustrated embodiment includes a refresh circuit 30. As described in more detail below, the refresh circuit 30 allows various voltage levels in the memory 25 to be regulated. The desired voltage level, as explained below, is provided using trim bits.

Figure 2:
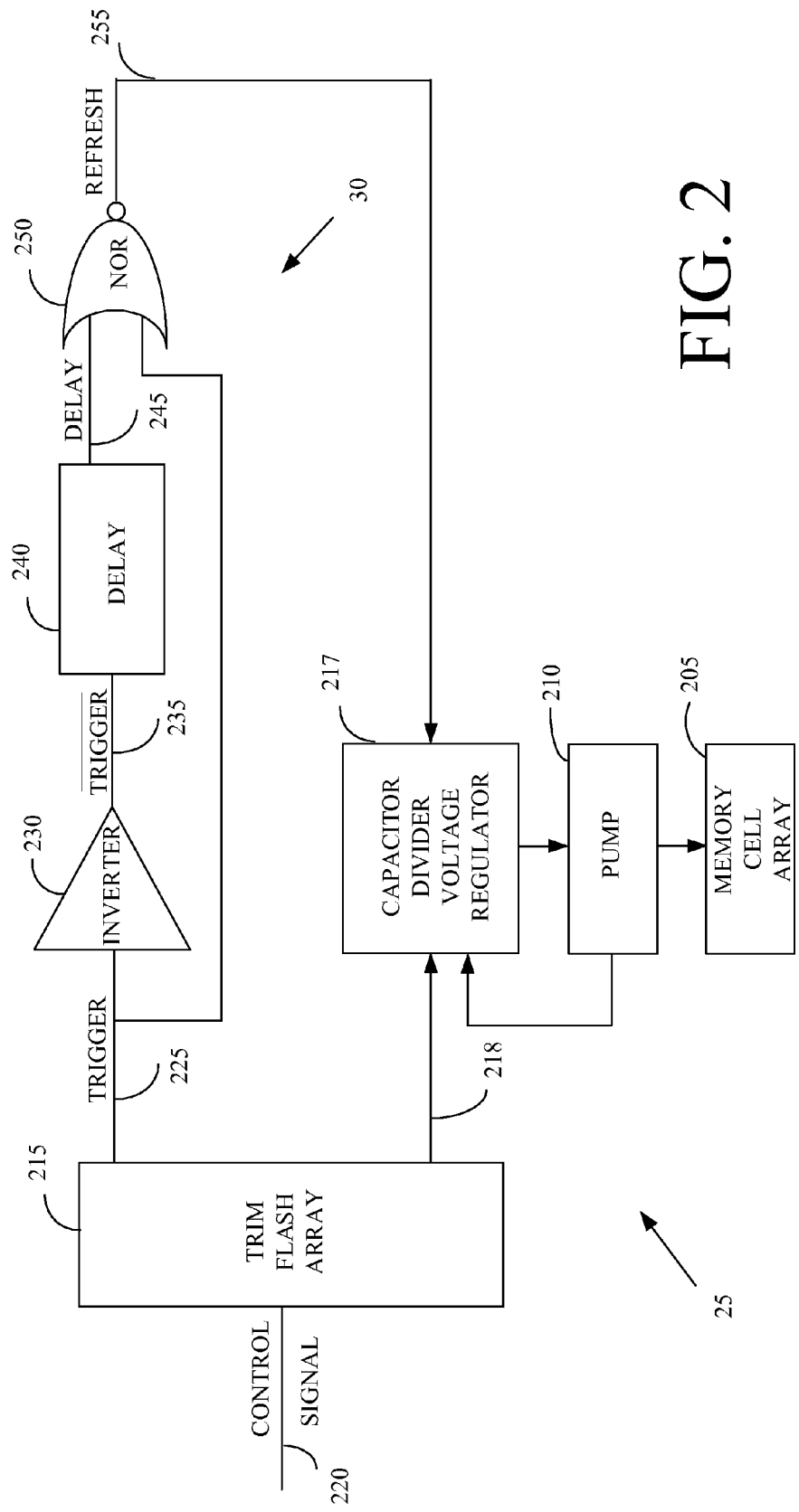
FIG. 2 is a block diagram of the memory of FIG. 1 employing the refresh circuit, in accordance with one embodiment of the present invention.

Turning now to FIG. 2, a block diagram of the memory 25 of FIG. 1 is illustrated, in accordance with one embodiment of the present invention. The memory 25 includes a memory cell array 205 for storing data. The memory cell array 205, in one embodiment, comprises one or more flash cells, which may be read upon application of a desired voltage level. The memory 25 also includes a pump 210 to charge an appropriate word line of the memory cell array 205. Although not so limited, in the illustrated embodiment, the pump 210 is a stand-by pump.

The memory 25 in the illustrated embodiment includes a trim flash array 215 that is adapted to receive a control signal from a line 220. The control signal in the illustrated embodiment is a word line signal for activating one or more cells in the memory cell array 205. The trim flash array 215, in one embodiment, provides trim bits to a capacitor-divider voltage regulator 217 on a line 218. An exemplary configuration of the capacitor-divider voltage regulator 217 is described later with reference to FIG. 3.

Referring again to FIG. 2, the trim bits of the trim flash array 215 regulate the voltage that is provided by the capacitor-divider voltage regulator 217. A new voltage level may be provided to the capacitor-divider voltage regulator 217, for example, during power-on mode. During the power-on mode, power is supplied to the memory cell array 205 from a power source, such as Vcc.

Generally, the trim bits are not available until the control signal on the line 220 reaches a desired level. Once the voltage on the line 220 reaches the desired level, the data represented by the trim bits becomes valid, and may thereafter be accessed by the capacitor-divider voltage regulator 217. As mentioned, the trim bits may represent the new voltage level that is desired. It is desirable to obtain the new voltage level provided by the trim bits expeditiously once the trim bits are accessible. However, because the capacitor-divider voltage regulator 217 may not detect the new voltage level until it is refreshed, one or more embodiments of the present invention provide the desired refresh signal to cause the new regulation voltage to take effect immediately.

The trim bits provided by the trim flash array 215 become accessible in response to receiving the control signal on the line 220. The trim flash array 215, in response to receiving the control signal on the line 220, outputs a trigger signal on a line 225. Although not so limited, the trigger signal in the illustrated embodiment is a logic low signal. The trigger signal on the line 225 is provided to an input terminal of an inverter 230 and to a first input terminal of a NOR gate 250. The inverter 230 inverts the trigger signal on the line 225 and provides the inverted trigger signal on a line 235 to an input terminal of a delay block 240.

The delay block 240 delays the inverted trigger signal on the line 235 by a preselected interval and provides a delayed signal via a line 245 to a second input terminal of the NOR gate 250. The inverted trigger signal on the line 235 may be inverted in a variety of ways, including using a series of inverters or using other well-known techniques.

The NOR gate 250 performs a NOR function on the received input signals and provides a refresh signal on a line 255 to the capacitor-divider voltage regulator 217. As described in more detail below, upon receiving the refresh signal on the line 255, the capacitor-divider voltage regulator 217 accepts a new voltage regulation value represented by the trim bits of the trim flash array 215.

It should be appreciated that the arrangement illustrated in FIG. 2 is exemplary in nature, and that, in alternate embodiments, different arrangements may be employed. For example, although the memory 25 in the illustrated embodiment employs the capacitor-divider voltage regulator 217, in an alternative embodiment, any other desirable voltage regulator may be employed that is capable of modifying voltage levels in the memory 25 upon being refreshed or initialized. As an additional example, in one embodiment, the trigger signal on the line 225 may be delayed by the delay block 240 instead of the inverted trigger signal on the line 235. Similarly, other configurations employing one or more of the components of FIG. 2 may be utilized without deviating from the spirit and scope of the present invention.

Figure 3:
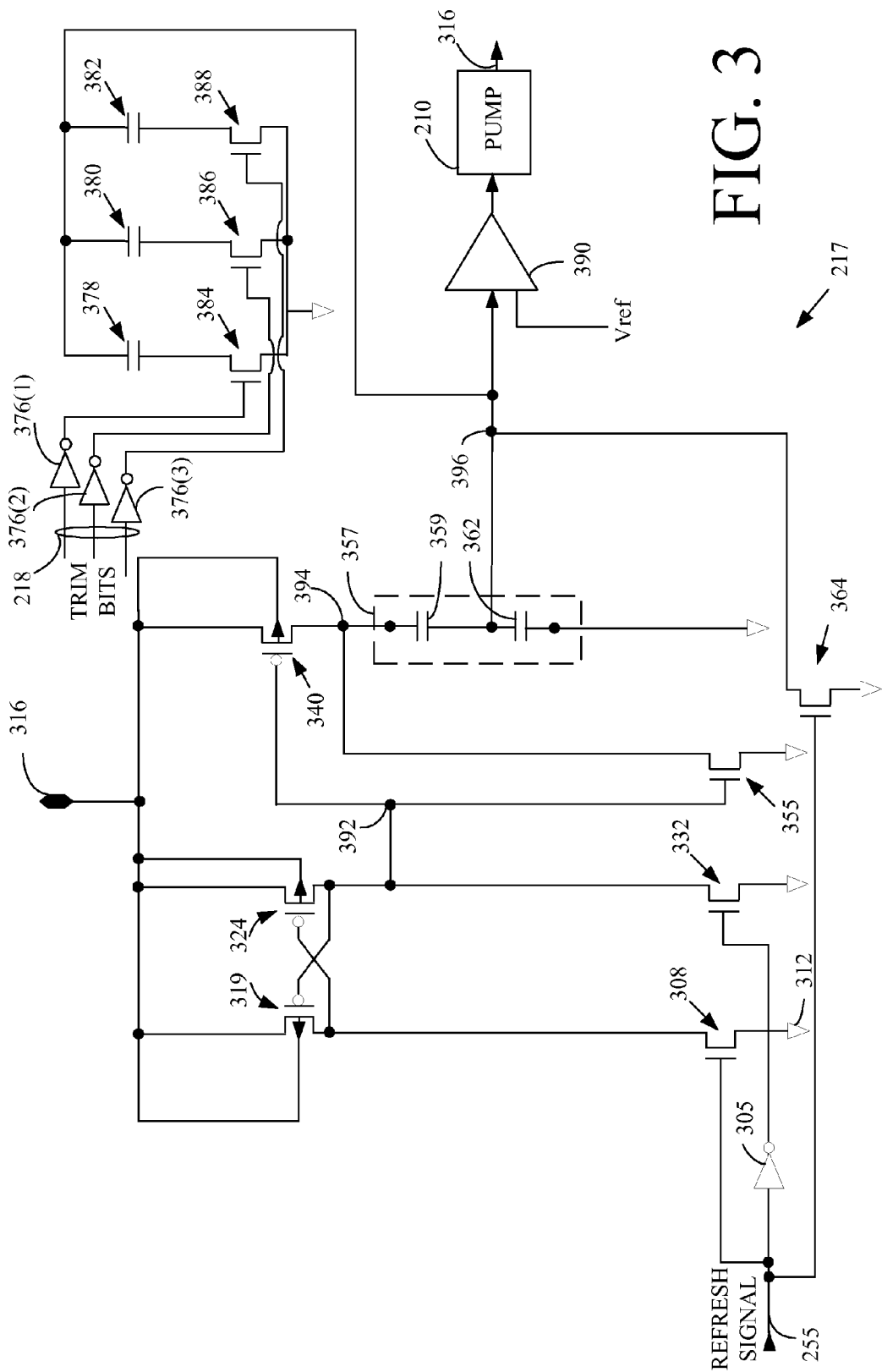
FIG. 3 illustrates a capacitor-divider voltage regulator that may be employed by the memory of FIG. 2, in accordance with one embodiment of the present invention.

Referring now to FIG. 3, a schematic diagram of the capacitor-divider voltage regulator 217 of FIG. 2 is illustrated, in accordance with one embodiment of the present invention. In the illustrated embodiment, the capacitor-divider voltage regulator 217 includes an inverter 305 adapted to receive the refresh signal from the line 255. The regulator 217 includes a transistor 308. A gate terminal of the transistor 308 is adapted to receive the refresh signal from the line 255. A drain terminal of the transistor 308 is coupled to ground node 312, and a source terminal of the transistor 308 is coupled to a drain terminal of a transistor 319. A source terminal of the transistor 319 is coupled to the output of the pump 210 at a node 316. The transistor 319 includes a N-well connection that is connected to the node 316, which may be the node that has the highest voltage level seen by the transistor 319. A gate terminal of the transistor 319 is coupled to a drain terminal of a transistor 324, and a gate terminal of the transistor 324 is coupled to the drain terminal of the transistor 319. The transistor 324 includes a N-well connection that is connected to the node 316. A source terminal of the transistor 324 is coupled to the source terminal of the transistor 319, and a drain terminal of the transistor 324 is coupled to a source terminal of a transistor 332. A gate terminal of the transistor 332 is coupled to an output terminal of the inverter 308, and a drain terminal of the transistor 332 is coupled to the ground node 312. The transistors 308, 319, 324 and 332 collectively form a level shifter that provides an output that is level shifted between the voltage value at the node 316 and ground.

A gate terminal of a transistor 340 is coupled to the drain terminal of the transistor 324, and a source terminal of the transistor 340 is coupled to the source terminals of the transistors 319, 324. The transistor 340 includes a N-well connection that is connected to the node 316. A gate terminal of a transistor 355 is coupled to the drain terminal of the transistor 324 and the gate terminal of the transistor 340, a source terminal of the transistor 355 is coupled to a drain terminal of the transistor 340, and a drain terminal of the transistor 355 is coupled to the ground node 312.

The regulator 217 includes a capacitor divider 357 including a first capacitor 359 and a second capacitor 362. A first terminal of the first capacitor 359 is coupled to the drain terminal of the transistor 340, and a second terminal of the first capacitor 359 is coupled to a first terminal of the second capacitor 362. A second terminal of the second capacitor 362 is coupled to the ground node 312.

The regulator 217 includes a transistor 364. A gate terminal of the transistor 364 is coupled adapted to receive the refresh signal from the line 255. A source terminal of the transistor 364 is coupled to the second terminal of the first capacitor 359, and a drain terminal of the transistor 364 is coupled to the ground node 364.

The regulator 217 is adapted to receive one or more (three in the illustrated embodiment) trim bits over the line 218 (see also FIG. 2). Each trim bit is provided to its respective inverter 376(1-3). An output terminal of the first inverter 376(1) is coupled to a gate terminal of a transistor 384. A source terminal of the transistor 384 is coupled to a first terminal of a capacitor 378, and a drain terminal of the transistor 384 is coupled to the ground node 312. An output terminal of the second inverter 376(2) is coupled to a gate terminal of a transistor 386. A source terminal of the transistor 386 is coupled to a first terminal of a capacitor 380, and a drain terminal of the transistor 386 is coupled to the ground node 312. An output terminal of the third inverter 376(3) is coupled to a gate terminal of a transistor 388. A source terminal of the transistor 388 is coupled to a first terminal of a capacitor 382, and a drain terminal of the transistor 388 is coupled to the ground node 312. A second terminal of each of the capacitors 378, 380, 382 is coupled to the second terminal of the first capacitor 359 of the capacitor-divider 357.

The regulator 217 includes a comparator 390. A first input terminal of the comparator 390 is coupled to the second terminal of the first capacitor 359, and a second input terminal of the comparator 390 is coupled to a reference voltage. An output terminal of the comparator 390 is coupled to the pump 210. The output from the pump 210 is fed back to the node 316, as well as provided to the memory cell array 205 (see FIG. 2).

The operation of the regulator 217 is described below. As described above, the refresh signal is provided on the line 255 once the trim bits are available on the line 218. When the refresh signal on the line 255 is asserted logic high, the level shifter comprising the transistors 308, 319, 324, and 332 provides an output signal that pulls the node 392 to a logic high, thereby turning off the transistor 340 and turning on the transistor 355. The transistor 355, when turned on, pulls a node 394 to a logic low. The refresh signal on the line 255, when asserted logic high, turns on the transistor 364, thereby pulling a node 396 to a logic low. As such, the capacitors 359, 362 are substantially grounded when the refresh signal is asserted, thereby initializing the capacitors 359, 362. The capacitors 359, 362 may be initialized for a preselected time, such 100 to 150 nanoseconds, in one embodiment.

When the trim bits on the line 218 are available, depending on the value of the trim bits, the transistors 384, 386, 388 are either turned on or turned off. When the transistors 384, 386, 388 are turned on, the respective capacitors 378, 380, 382 are shorted to ground. The capacitors 378, 380, 382, when shorted to ground, are connected in parallel with the capacitor 362 of the capacitor-divider 357. This arrangement thus alters the capacitance ratio of the regulator 217, thereby changing the voltage level to which the pump 210 regulates. The capacitors 378, 380, 382 may be of varying size, in one embodiment. The comparator 390 provides an enable signal to the pump 210 based on comparing the voltage level of the node 296 and the reference voltage level.

When the refresh signal on the line 255 is asserted logic low, the transistor 332 is turned on, thereby causing the transistor 340 to turn on as well. When the transistor 340 is turned on, the first capacitor 359 of the capacitor-divider 357 is shorted to the output of the pump 210 (i.e., shorted to the node 316).

Figure 4:
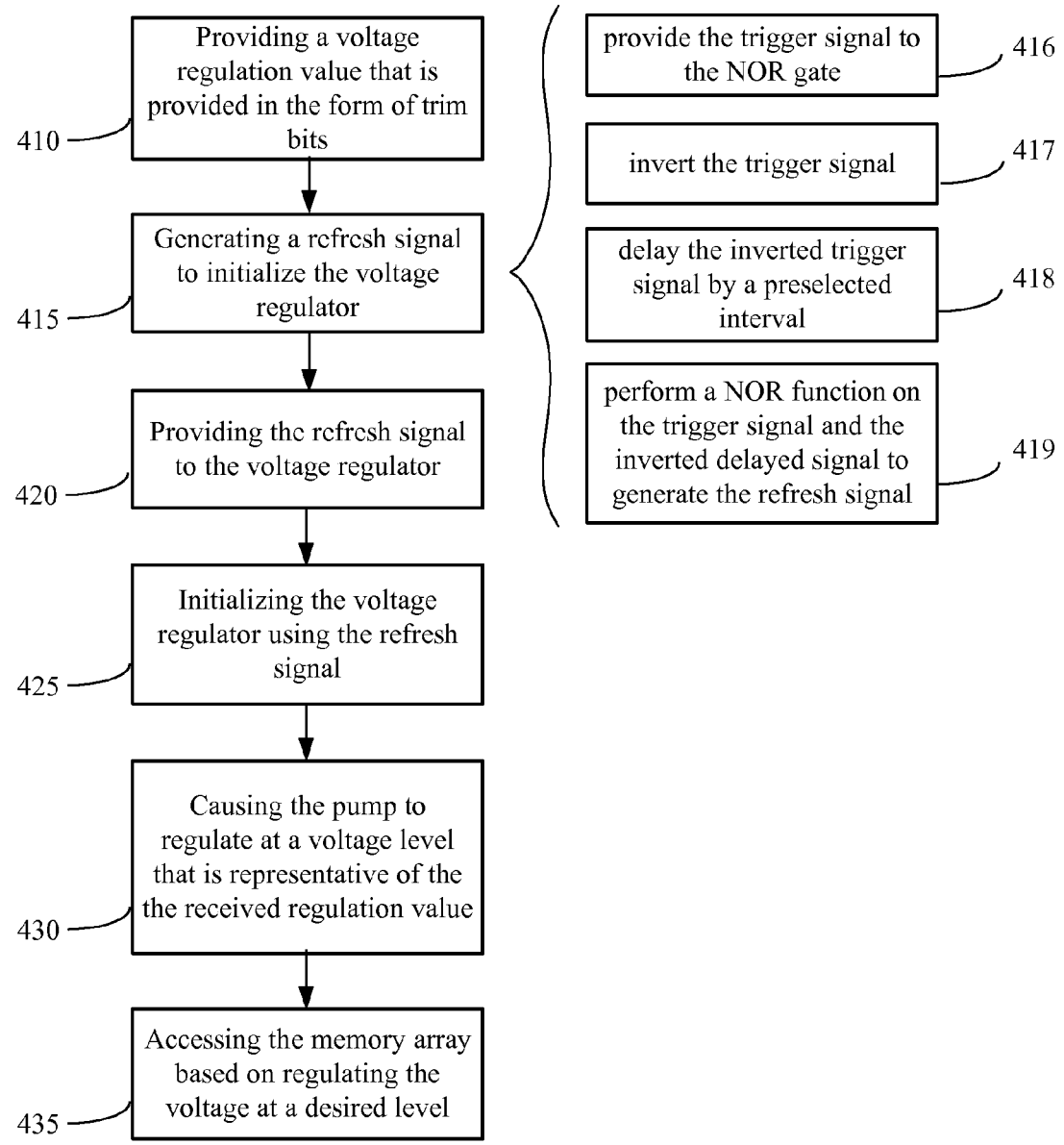
FIG. 4 illustrates a flow diagram that may be employed by the memory of FIG. 2, in accordance with one embodiment of the present invention.

Referring now to FIG. 4, a flow diagram of a method that may be implemented in the memory 25 of FIG. 2 is illustrated, in accordance with one embodiment of the present invention. The control signal on the line 220, when asserted, provides (at 410) a voltage regulation value in the form of trim bits over the line 218 to the capacitor-divider voltage regulator 217. As described below, the capacitor-divider voltage regulator 217 recognizes the new voltage regulation value upon being initialized by the refresh signal.

The refresh circuit 30 of the memory 25 generates (at 415) the refresh signal to initialize the capacitor-divider voltage regulator 217. In one embodiment, the refresh signal is generated (at 415) by: providing (at 416) the trigger signal on the line 225 (see FIG. 2) to the first input terminal of the NOR gate 250; inverting (at 417) the trigger signal using the inverter 230; delaying (at 418) the inverted trigger signal by the preselected interval using the delay block 240; performing (at 419) a NOR function using the NOR gate 250 on the trigger signal from the line 225 and the inverted delayed trigger signal from the line 245 and then generating the refreshed signal. In one embodiment, and as described in more detail below, the preselected interval delay inserted by the delay block 240 determines the pulse width of the refresh signal on the line 255.

The refresh circuit 30 provides (at 420) the refresh signal to the capacitor-divider voltage circuit 217, which is then initialized (at 425) using the refresh signal on the line 255. The capacitor-divider voltage circuit 217, when refreshed or initialized, accesses the trim bits provided by the trim flash array 215 to obtain the new voltage regulation value.

Once the capacitor-divider voltage circuit 217 is initialized (at 425), the capacitor-divider voltage circuit 217 causes the pump 210 to regulate at the voltage level that is representative of the received voltage regulation value (at 410). Once the pump 210 regulates the voltage at the desired level, the contents of the memory cell array 205 may be accessed. In one embodiment, data may be read from or written to the memory cell array 205.

The refresh circuit 30, in one embodiment, provides the refresh signal after the trim data is available from the trim flash array 215. This is because the refresh circuit 30, as shown in FIG. 2, exists in the same trim flash array 215 for the same word line as the capacitor-divider voltage regulator 217. Accordingly, because the refresh circuit 30 provides the refresh signal to the capacitor-divider voltage regulator 217 after the trim data is available, there may not be a need to strictly control refresh and fuse timings during a power-up sequence. Furthermore, by providing the refresh signal once the trim bits are accessible, the refresh circuit 30, in one embodiment, substantially prevents the capacitor-divider voltage regulator 217 from entering an unregulated state. As such, the pump 210 under the control of the capacitor-divider voltage regulator 217 regulates to the desired (as opposed to an overly high or low) voltage value.

Referring now to FIG. 5, an exemplary timing diagram of various signals in the memory 25 of FIG. 2 is illustrated. In particular, FIG. 5 illustrates the transitions of the control signal that is provided on the line 220 (see FIG. 2), the trigger signal that is provided on the line 225, the inverted trigger signal that is provided on the line 235, the inverted delayed trigger signal that is provided on the line 245, and the refresh signal that is provided on the line 255.

As shown in FIG. 5, the control signal that is provided to the trim flash array 215 on the line 220 transitions from low to high at time $t_0$. In response to the transition of the control signal on the line 220, the trigger signal on the line 225 from the trim flash array 215 transitions from high to low at time $t_0$. At time $t_0$, the inverter 230 inverts the trigger signal, and, as such, the inverted signal transitions from low to high on the line 235.

The inverted trigger signal on the line 235 is delayed by a period of time, T. Accordingly, the transition of the delayed signal from low to high occurs at time $t_1$ ($t_0$+T) The NOR gate 250 performs a NOR function on the trigger signal on the line 225 and the delayed inverted trigger signal on the line 245 to provide the refresh signal on the line 255, as shown in FIG. 5. The width of the refresh signal on the line 255 is T, which is the delay time introduced by the delay block 240. Thus, in one embodiment, the width of the refresh signal on the line 255 may be accordingly adjusted by varying the delay introduced by the delay block 240. In one embodiment, the delay introduced by the delay block 240 may be programmable and may vary from one implementation to another. The amount of time needed to charge the capacitors 310, 320 of the capacitor-divider voltage regulator 217 may determine the amount of delay (and hence refresh-signal width) that is desired. Adjusting the amount of delay provided by the delay block 240 to control the duration of the refresh signal on the line 255 pulse provides a larger window to refresh the capacitor-divider voltage regulator 217.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
    storing trim bits in a trim flash array, where the trim bits define a voltage value and where the voltage value is accessible once a control signal provided to the trim flash array reaches a selected voltage level, wherein the control signal represents a word line signal;
    providing a refresh signal to a voltage regulator in response to the control signal reaching the selected level, causing the voltage regulator to change its regulation value to that defined by the trim bits;
    providing, using the voltage regulator, a signal at a voltage level represented by the voltage value to a memory array; and
    accessing the memory array based on the provided signal.

2. The method of claim 1, wherein initializing the voltage regulator comprises adjusting a charge of one or more capacitors of a capacitor divider voltage regulator to the voltage value.

3. The method of claim 1, wherein initializing the voltage regulator comprises initializing one or more capacitors of the voltage regulator to a preselected value for a preselected interval.

4. The method of claim 1, wherein providing the refresh signal comprises inverting the control signal to produce an inverted signal, delaying the inverted signal by a selected interval, providing the delayed inverted signal to a NOR gate to provided the refresh signal.

5. A memory, comprising:
    a memory cell array;
    a trim flash array adapted to provide a voltage regulation value in response to receiving a word line signal;
    a refresh circuit communicatively coupled to the trim flash array, comprising:
        an inverter adapted to invert the word line signal; and
        a delay element adapted to delay the inverted word line signal by a selected time interval;
        a gate adapted to provide a refresh signal based on at least one of the word line signal and the delayed inverted word line signal;
    a voltage regulator communicatively coupled to the trim flash array and the refresh circuit, wherein the voltage regulator is adapted to provide a signal of a voltage level that is indicated by the voltage regulation value to the memory cell array based on the refresh signal.

6. The memory of claim 5, wherein the voltage regulator is a capacitor-divider voltage regulator.

7. The memory of claim 5, further comprising a pump coupled between the voltage regulator and the memory cell array.

8. The memory of claim 7, wherein the pump is a standby pump.

9. A system, comprising:
    a device; and a memory that is accessible by the device, wherein the memory comprises:
a memory cell array;
a trim flash array adapted to provide a voltage regulation value in response to receiving a word line signal;
a refresh circuit communicatively coupled to the trim flash array, comprising:
   an inverter adapted to invert the word line signal; and
   a delay element adapted to delay the inverted word line signal by a selected time interval;
   a gate adapted to provide a refresh signal based on at least one of the word line signal and the delayed inverted word line signal;
a voltage regulator communicatively coupled to the trim flash array and the refresh circuit, wherein the voltage regulator is adapted to provide a signal of a voltage level that is indicated by the voltage regulation value to the memory cell array based on the refresh signal.

10. The system of claim 9, wherein the memory further comprises a pump connected between the voltage regulator and the memory cell array.

11. The system of claim 9, wherein the device is at least one of a camera, computer, telephone, and personal digital assistant.

* * * * *